United States Patent [19]

Nulman et al.

[11] Patent Number: 5,460,703
[45] Date of Patent: Oct. 24, 1995

[54] LOW THERMAL EXPANSION CLAMPING MECHANISM

[75] Inventors: Jaim Nulman, Palo Alto; Robert E. Davenport, Sunnyvale, both of Calif.

[73] Assignee: Applied Materials, Inc., Santa Clara, Calif.

[21] Appl. No.: 317,415

[22] Filed: Oct. 3, 1994

Related U.S. Application Data

[63] Continuation of Ser. No. 975,181, Nov. 12, 1992, abandoned.

[51] Int. Cl.$^6$ ............................ C23C 14/34; B05C 13/00
[52] U.S. Cl. ................ 204/192.12; 204/298.09; 204/298.15; 204/298.31; 204/192.32; 156/345; 118/503; 118/728
[58] Field of Search ................ 204/298.02, 298.09, 204/298.15, 298.23, 298.25, 298.26, 298.31, 192.12, 192.32; 156/345; 118/503, 728

[56] References Cited

U.S. PATENT DOCUMENTS

| | | | |
|---|---|---|---|
| 4,522,697 | 6/1985 | Dimock et al. | 204/298.15 X |
| 4,869,801 | 9/1989 | Helms et al. | 204/298.15 |
| 4,952,299 | 8/1990 | Chrisos et al. | 204/298.25 |
| 4,978,412 | 12/1990 | Aoki et al. | 204/298.15 X |
| 5,092,978 | 3/1992 | Kojima et al. | 204/298.15 |
| 5,108,569 | 4/1992 | Gilboa et al. | |
| 5,238,499 | 8/1993 | van de Ven et al. | 156/345 X |
| 5,262,029 | 11/1993 | Erskine et al. | 156/345 X |
| 5,292,399 | 3/1994 | Lee et al. | 156/345 X |

FOREIGN PATENT DOCUMENTS

| | | | |
|---|---|---|---|
| 0430229 | 11/1990 | European Pat. Off. | H01J 37/32 |
| 0489439 | 12/1991 | European Pat. Off. | C23C 16/44 |
| 3232967 | 10/1991 | Japan | 204/298.15 |

OTHER PUBLICATIONS

The Condensed Chemical Dictionary, 9th Edition, pp. 178 and 412–413.
Hackh's Chemical Dictionary, 4th Edition, pp. 142–143 and 562.

*Primary Examiner*—Nam Nguyen
*Attorney, Agent, or Firm*—Michael A. Glenn

[57] ABSTRACT

An improved clamping ring, useful for securing a semiconductor wafer during wafer processing, for example in a physical vapor deposition system, is made of a thermally nonconductive material having a low thermal coefficient of expansion, for example a ceramic material, such as alumina. Such material, by exhibiting only slight expansion or contraction during thermal cycling, allows the production of a clamping ring having the largest possible inner diameter, such that more wafer surface area is available for device fabrication, and such that wafer shadowing that results from metal film build-up on the clamping ring is mitigated, thereby extending the useful life of the clamp ring and reducing system downtime. Additionally, the thermal stability provided by the present invention improves wafer temperature uniformity, and therefore also improves per wafer device yield while increasing device reliability.

5 Claims, 2 Drawing Sheets

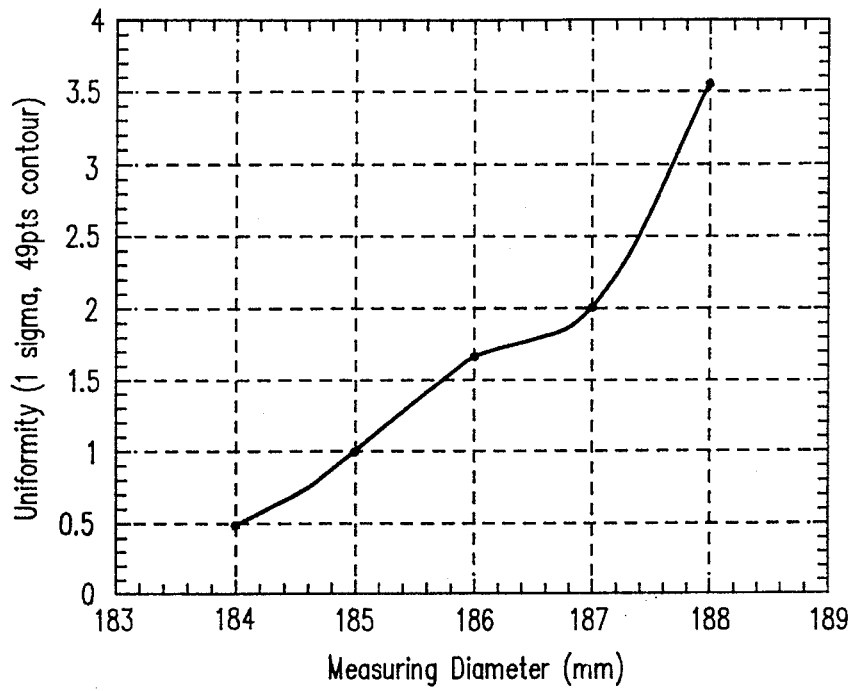
FIG. 3
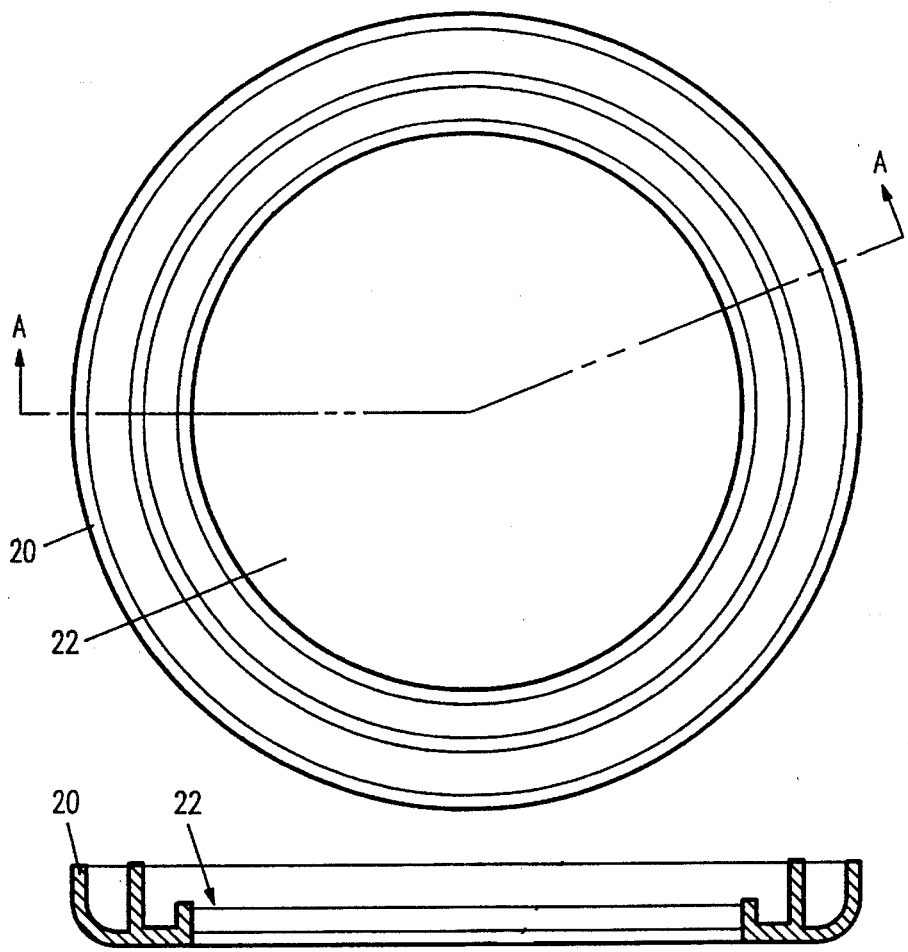
FIG. 4a
FIG. 4b

LOW THERMAL EXPANSION CLAMPING MECHANISM

This is a continuation of application Ser. No. 07/975,181, filed: Nov. 12, 1992, abandoned.

BACKGROUND OF THE INVENTION

1. Technical Field

The present invention relates to semiconductor wafer processing. More particularly, the present invention relates to securing semiconductor wafers against movement during wafer processing.

2. Description of the Prior Art

It is often beneficial to secure a semiconductor wafer against movement during the various wafer processing steps that must be performed when fabricating integrated circuits. In this way precision tolerances may be more readily maintained, allowing the fabrication of devices having very fine features, while assuring reproducibility and improving wafer yields. An example of a wafer processing step during which the wafer must be secured against movement is set forth in U.S. Pat. No. 5,108,569, in which a clamping mechanism is used to secure a wafer to a platform during the formation of a stoichiometric layer of a metal compound on a wafer surface.

In a physical vapor deposition ("PVD") system, such as is useful for depositing a metal film on a semiconductor wafer surface, a metal clamping ring 10 (see FIG. 1) is commonly used to secure the semiconductor wafer 12 during wafer processing. One problem often encountered with the use of metal clamping rings involves the plasma generated during PVD metal film deposition, which generates intense heat that causes the metal clamping ring to expand. Such expansion results in an increased clamping ring diameter which may exceed that of the wafer, such that the wafer can become attached or stuck inside the clamping ring, causing the wafer to break when the clamping ring again contracts.

Providing a clamping ring with a smaller inner diameter to account for ring expansion when the ring is heated reduces the usefulness of the clamping ring when less than full thermal cycling is achieved, or when wafer processing is performed in noncontinuous mode operation, i.e. when the clamping ring in repeatedly heated and cooled and, therefore, allowed to repeatedly expand and contract. A clamping ring having a smaller inner diameter covers a greater amount of the wafer surface for any processing steps that are performed while the clamping ring is maintained at lower temperatures, e.g. where the ring has not expanded to its largest inner diameter. This additional surface coverage significantly reduces effective wafer surface available for processing and, accordingly, reduces wafer yields.

During standard PVD processing, deposition of a metal film on the surface of a semiconductor wafer produces a metal film build-up 14 on the surface of the clamping ring 10. Over time, this build-up extends the height and inner diameter of the clamp ring and thus affects the profile of the clamping ring. For example, the build-up of metal film on the clamping ring shadows an intended metal film deposition on the surface of the wafer near the edge of the wafer.

In reference to the wafer centerline 18 in FIG. 1, the effective useful wafer diameter 16 is significantly decreased by such shadowing, which reduces the amount of wafer surface available for integrated circuit fabrication. Thus, the amount of wafer surface area available for device fabrication is decreased by both the metal film build-up on the clamping ring surface and the need to reduce the clamping ring inner diameter to compensate for expansion and contraction of the clamping ring due to thermal cycling.

The shadow cast upon the wafer surface near the wafer edge by the build-up affects the uniformity of metal film deposition on the wafer surface. The phenomenon is best understood with reference to FIG. 2, which is a graph plotting the thickness of a deposited aluminum film on a semiconductor wafer surface vs. distance along the wafer surface from a wafer edge; and FIG. 3, which is a graph plotting uniformity of a deposited aluminum film on a semiconductor wafer surface vs. distance along the wafer surface from a wafer edge In FIG. 2, the thickness of a deposited aluminum film (expressed as Å*1000) is shown having a rapid drop-off as the edge of the subject semiconductor wafer is approached. As a clamping ring acquires an increasingly thick metal film build-up with use, the point along the wafer surface from the edge at which this drop-off occurs extends increasingly away from the wafer edge and toward the center of the wafer. Because a significant percentage of the wafer surface area is lost when even a small portion of the wafer surface at the wafer periphery is unusable, any movement of the edge drop-off toward the center of the wafer can have disastrous effects on wafer yield and, as a result, per device cost of manufacture.

FIG. 3 shows the shadowing effect produced by a clamping ring after 2340 microns of aluminum film have been deposited on the clamping ring surface. It can be seen in the Figure. that as the edge of a 200 mm wafer is approached (i.e. at a larger measuring diameter), sheet resistance uniformity of aluminum alloy films deposited on the wafer surface exceeds 3.5% at 1 sigma (i.e. at one standard deviation), with a 49 point contour.

It is the current industry experience that a 1 sigma measurement (as is shown in FIG. 3) is not an acceptable standard for applications employing modern submicron technology. When applying modern standards (i.e. 3 sigma), the sheet resistance uniformity of aluminum alloys on 200 mm wafers exceeds 5%, with a 49 point contour, after just 1000–1500 microns of metal film build-up on a clamping ring.

When a clamping ring is new, the deposited metal film builds up gradually on the clamping ring surface, such that shadowing progresses gradually from the point at which the clamping ring contacts the wafer inwardly toward the point of nominal wafer thickness (at about 6 mm from the edge of the wafer). As the clamping ring ages, this inward transition is much steeper.

When the build-up on the clamping ring surface becomes thick enough to interfere with wafer yields, the clamping ring must be replaced. Currently, clamping rings are replaced when the build-up approaches 1000 microns. The clamping rings can be chemically cleaned; however, the selectivity of the chemical wet etch that is used to clean the clamping ring is limited and tends to reduce the clamping ring effectiveness over time. That is, known clamping rings may only be cleaned a limited number of times.

The cost of replacement clamping rings is not insignificant, about $4000–$5000 each. However, it is much more significant that a fabrication process must be shut down for 10–14 hours every 2–3 days to replace a worn clamping ring. This downtime has a profound effect on fab efficiency and throughput. Reducing such downtime would significantly increase fab efficiency and throughput and, as a result, profitability.

A further disadvantage of metallic clamping rings is their inherent thermal conductivity. Such clamping rings add heat to the wafer or act as a heat sink at the wafer edge, depending upon the relative temperature of the process environment in which the clamping ring is used. The thermal volatility of such known clamping rings can cause temperature non-uniformity across the wafer and result in reduced wafer yields and degraded device reliability.

SUMMARY OF THE INVENTION

The present invention provides an improved clamp that is useful for securing a semiconductor wafer during wafer processing, for example in a physical vapor deposition ("PVD") system. In the preferred embodiment of the invention, such clamp is a ring that is made of a material having a low thermal coefficient of expansion, for example a ceramic material, such as alumina. Such material, by exhibiting only slight expansion or contraction during thermal cycling, allows the production of a clamping ring having the largest possible inner diameter, such that more wafer surface area is available for device fabrication, and such that wafer shadowing which results from metal film build-up on the clamping ring is mitigated. In this way, the invention extends the useful life of the clamp ring and, therefore, reduces system downtime. Because the clamping ring of the present invention is thermally stable under varying processing conditions, wafer temperature uniformity is improved. Additionally, a clamping ring made of ceramic and ceramic-like materials is easier to recycle due to the superior selectivity when wet etching metal films deposited on the ceramic materials to clean the clamping ring surface, when compared with the selectivity of the wet etching process when metal films are cleaned from a metal surface.

BRIEF DESCRIPTION OF THE DRAWINGS

FIG. 3 is a graph plotting uniformity of a deposited aluminum film on a semiconductor wafer surface vs. distance along the wafer surface from a wafer edge;

FIG. 4a is a plan view of an improved semiconductor wafer clamp ring according to the present invention; and FIG. 4b is a cross sectional view of the improved semiconductor wafer clamp ring of FIG. 4a, taken along the dotted line "AA", as identified in FIG. 4a.

DETAILED DESCRIPTION OF THE INVENTION

Figure 1:
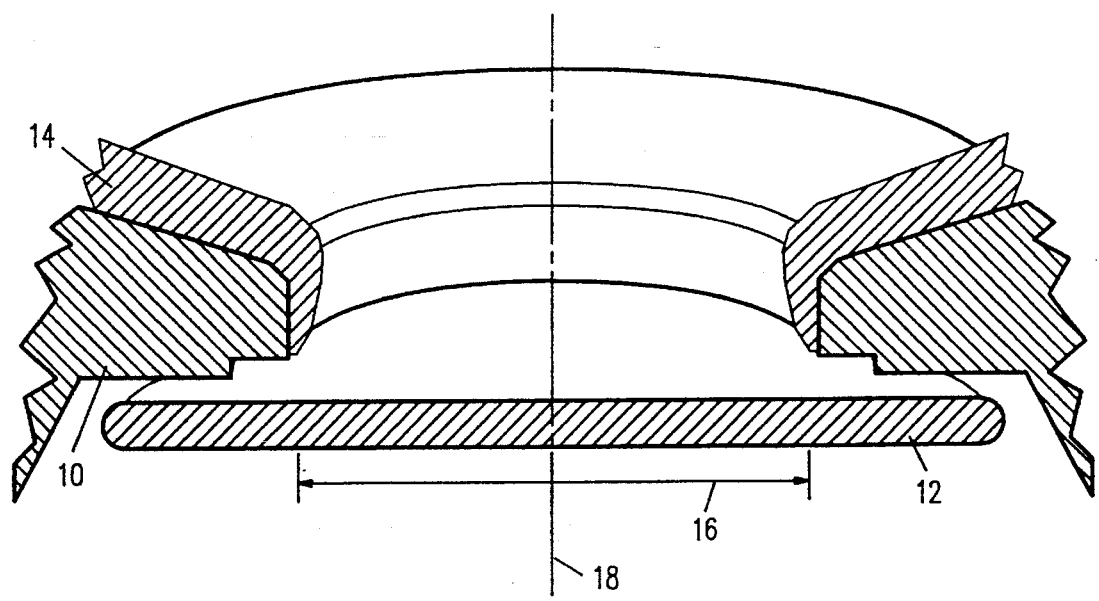
FIG. 1 is a partial cross sectional view of a prior art semiconductor wafer clamp ring.
Figure 2:
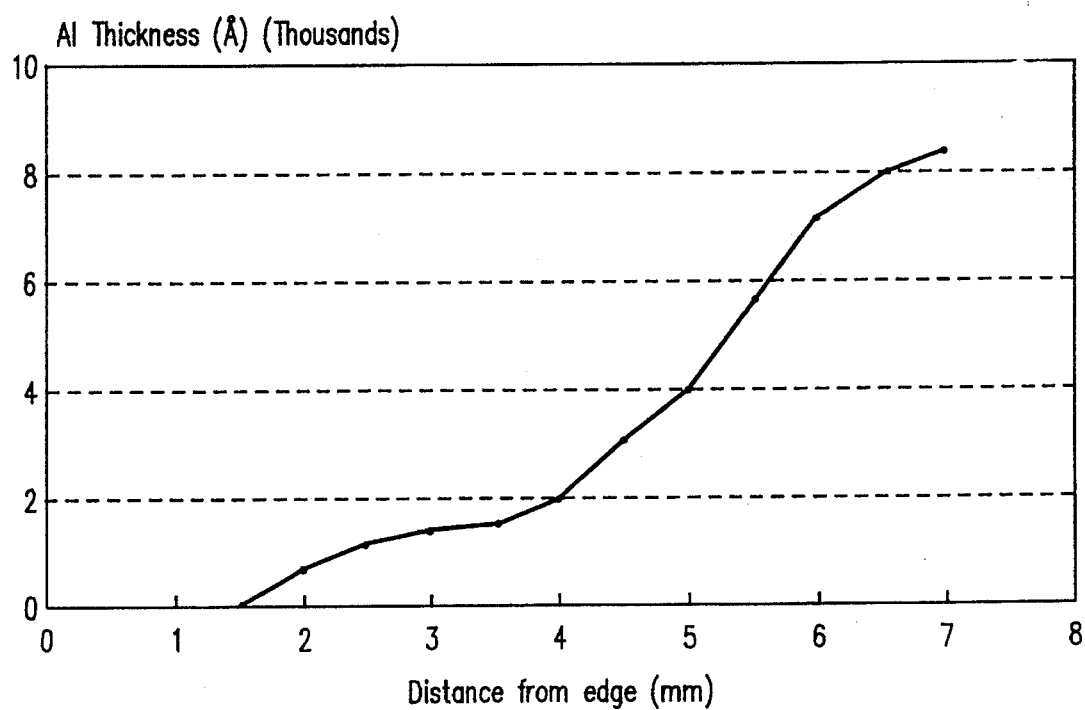
FIG. 2 is a graph plotting the thickness of a deposited aluminum film on a semiconductor wafer surface vs. distance along the wafer surface from a wafer edge.

The present invention is best understood by referring to the Drawings in connection with review of this Description.

The present invention provides an improved clamping ring that is useful for securing a semiconductor wafer against movement during wafer processing, for example in a PVD system. FIG. 4a is a plan view of the improved semiconductor wafer clamping ring 20. The ring is doughnut-shaped and has at least one planar clamping surface configured for abutting opposition to a wafer surface to secure the wafer against unwanted movement during wafer processing. For purposes of the present invention, the clamping ring may be moved into a clamping position, such that it is brought to bear upon or impose upon a clamping surface of a stationary wafer and thereby secure the wafer; or the clamping ring may remain stationary, such that it receives and retains a wafer that is brought to bear upon the clamping surface of the clamping ring; or clamping may be accomplished through a combination of relative movement of the clamping ring and the wafer.

The clamping ring is formed having an inner diameter which defines an opening 22. The ring clamps a wafer at a periphery of the wafer surface. The opening 22 exposes the rest of the wafer surface to a processing environment. It is important to minimize the amount of wafer surface area used for clamping. In this way, a maximum amount of the wafer surface is available for the fabrication of integrated circuits, thereby increasing device yield per wafer. In accordance with the present invention, the clamping ring is formed such that the opening allows maximum wafer surface exposure to the processing environment, while it provides a minimal abutment with the periphery of the wafer surface to secure the wafer against unwanted movement.

FIG. 4b is a cross sectional view of the improved semiconductor wafer clamp ring 20 of FIG. 4a, taken along the dotted line "AA", as identified in FIG. 4a. The clamping ring of FIGS. 4a and 4b is shown as a doughnut-shaped ring for purposes of example. The various surfaces shown in FIG. 4b represent the preferred embodiment of the present invention, as the invention is adapted for a specific application. The present invention may be practiced with any other desired clamping configuration Therefore, it is not necessary that the clamp be a ring but, rather, the clamp could be oval shaped, rectangular, square, etc. as long as the clamp defines an opening that allows maximum exposure of a wafer surface to a processing environment.

Currently, the only known way to produce a clamping ring is to use any of various metals or metallic alloys. As discussed above, the clamping ring must not have a large diameter or the clamping ring could expand beyond the periphery of the clamped wafer when the clamp is heated, thereby permitting the wafer to become attached or stuck inside the clamping ring, causing the wafer to break.

A critical characteristic of the clamping ring of the present invention is that the ring does not expand or contract at all, or at most, only slightly, when subjected to thermal cycling because the clamping ring is formed of a material having a low thermal coefficient of expansion and low thermal conductivity. By providing a clamping ring that is dimensionally stable (e.g. a ring having an inner diameter that remains relatively constant) during conditions of thermal cycling, it is possible to disregard the prior art requirement that the clamping ring be designed to have a narrow opening to compensate for expansion of the ring when the ring is heated. By providing a clamping ring having low thermal conductivity, the thermal stability of a wafer during wafer processing is improved.

In the preferred embodiment of the invention, the clamping ring is formed of a material having a low thermal constant of expansion and low thermal conductivity, such as a ceramic material, e.g. alumina, aluminum nitride, calcium carbonate, etc., or any other thermally stable material, such as Kova®. Such ceramic and ceramic-like materials are also easier to recycle than standard metal clamping rings.

The clamping ring of the present invention may be shaped, cast, or otherwise formed to a desired shape using known techniques for the material chosen.

One advantage of the present invention is that the foregoing materials are readily cleaned of metal film deposits. Chemical etch cleaning has a much higher selectivity of metal when the metal is coated on a ceramic surface when compared to chemical etch selectivity for metal coated on metal. This property of the present invention provides a clamping ring that is able to withstand more cleaning cycles than a conventional clamping ring, while resisting dimensional change caused to conventional clamping rings by such cleaning.

The use of a material having a low thermal coefficient of expansion in the present invention also allows the clamping ring to have the maximum possible inner diameter, while providing a sufficient clamping surface to clamp a wafer. The clamping ring of the present invention exhibits little or no dimensional change during thermal cycling. Because the clamping ring design need not consider dimensional change due to thermal cycling, a clamping ring may be provided having a larger inner diameter than was previously possible. Thus, a major advantage of the present invention is that it provides a clamping ring having a larger inner diameter.

In addition to increasing the amount of wafer surface area available for integrated circuit fabrication, the invention is particularly useful in applications, such as metal film deposition in a physical vapor deposition system, where clamping ring profile is increased by metal film build-up on the outer surfaces of the clamping ring.

Although metal film build-up occurs as readily on the clamping ring surfaces in the present invention as it does on the surfaces of prior art clamping rings, the larger opening afforded by the present invention allows the clamping ring to be used for a longer period of time until it needs replacement. Although the rate of metal film build up is the same in either case, the present invention has a larger diameter and can therefore accommodate a greater amount of metal film build up on its surface before the inner diameter is reduced to the degree that wafer shadowing begins to affect film thickness and sheet resistivity on the wafer surface.

It has been found that when the clamping ring of the present invention is used in a PVD system, where a metal film is deposited onto the clamping ring outer surfaces incidental to film deposition on a wafer surface, the present invention allows use of the clamping ring until a metal film layer having a thickness of at least 3000 microns is built up on the clamping ring surface. As discussed above, prior art clamping rings must be replaced when the deposited metal film layer approaches 1000 microns. In this way, the present invention provides a significant improvement in clamping ring life. This results in less need for frequent PVD system maintenance and less system downtime. Thus, throughput and cycle time are improved.

It has also been found that when a conventional clamping ring is used in a PVD system, the temperature of the wafer near the near the clamping ring can be significantly different than the temperature at the center of the wafer. This effect is caused by plasma induced electron bombardment of the clamping ring during deposition which heats the clamping ring. Thus, heat is transferred by the clamping ring to or from the wafer, depending upon relative wafer temperature.

Such wafer temperature non-uniformity causes grain size non-uniformities across the wafer surface, and may also cause differences in the amount of metal that is flowed into contacts across the wafer. These phenomena lower per wafer device yield and limit device reliability.

The clamping ring of the present invention is thermally nonconductive. It has been found that use of the present invention significantly reduces or eliminates such non-uniformity and, therefore, reduces or eliminates the problems attendant with thermal non-uniformity which are discussed above.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

We claim:

1. An apparatus for securing a semiconductor wafer against movement during wafer processing, comprising:

a doughnut-shaped clamping ring having an inner diameter defining a ring opening and having at least one continuous planar clamping surface for abutting opposition along the entire periphery of a wafer surface to effect water clamping wherein said clamping ring is made from a material selected from the group consisting of alumina, aluminum nitride, and calcium carbonate, said material having a low thermal coefficient of expansion, such that said clamping ring inner diameter remains constant or nearly constant when said ring is subjected to thermal cycling, such that wafer shadowing that results from deposited film build-up on said clamping ring is mitigated.

2. The apparatus of claim 1, wherein clamping ring is thermally nonconductive.

3. In a physical vapor deposition system, an apparatus for securing a semiconductor wafer processing, comprising:

a doughnut-shaped clamping ring having an inner diameter defining a ring opening and having at least one continuous planar clamping surface for abutting opposition to said wafer surface to effect wafer clamping along the entire periphery of said wafer surface, wherein said clamping ring is made from a material selected from the group consisting of alumina, aluminum nitride, and calcium carbonate, said material having a low thermal coefficient of expansion, said material exhibiting at most only slight expansion and contraction during thermal cycling, wherein said clamping ring inner diameter remains constant or nearly constant during said thermal cycling, and such that wafer shadowing that results from deposited film build-up on said clamping ring is mitigated.

4. The apparatus of claim 3, wherein said clamping ring is thermally nonconductive.

5. A method for securing a semiconductor wafer during wafer processing while allowing maximum exposure of wafer surface to a process environment, comprising the steps of:

securing said wafer against unwanted movement with a doughnut-shaped clamping ring having at least one continuous planar clamping surface in abutting opposition along the entire periphery of a water surface and having an inner diameter which defines an area of process environment exposure for said water surface;

processing said wafer; and maintaining said inner diameter constant or nearly constant during thermal cycling attendant with said wafer processing by forming said clamping ring made of a material selected from the group consisting of alumina, aluminum nitride, and calcium carbonate, said material having a low thermal coefficient of expansion, such that wafer shadowing that results from deposited film build-up on said clamping ring is mitigated.

* * * * *